United States Patent [19]

Suehiro et al.

[11] Patent Number: 4,937,016
[45] Date of Patent: Jun. 26, 1990

[54] COPPER CONDUCTOR COMPOSITION

[75] Inventors: Masatoshi Suehiro; Masashi Echigo; Masami Sakuraba; Nobutoshi Kawamura, all of Kyoto, Japan

[73] Assignees: Dai-Ichi Kogyo Seiyaku Co., Ltd., Kyoto; Dowa Mining Co., Ltd., Tokyo; Matsushita Electric Industrial Co., Ltd., Kadoma, all of Japan

[21] Appl. No.: 304,631

[22] Filed: Feb. 1, 1989

[51] Int. Cl.$^5$ .............................................. H01B 1/06
[52] U.S. Cl. .................... 252/512; 252/518; 252/519; 106/1.13; 106/1.29
[58] Field of Search ...................... 252/512, 518, 519; 106/1.13, 1.18, 1.22, 1.23, 1.26, 1.29

[56] References Cited

U.S. PATENT DOCUMENTS

| 4,409,261 | 10/1983 | Kwo | 252/12 |
| 4,521,329 | 6/1985 | Siuta et al. | 252/512 |
| 4,540,604 | 9/1985 | Siuta | 252/518 |
| 4,687,597 | 8/1987 | Siuta | 252/512 |
| 4,714,570 | 12/1987 | Nakatani et al. | 252/518 |

Primary Examiner—Josephine Barr
Attorney, Agent, or Firm—Armstrong, Nikaido, Marmelstein, Kubovcik & Murray

[57] ABSTRACT

A copper conductor composition comprising a copper powder, an inorganic oxide powder, a glass powder and an organic vehicle, said copper powder having an average particle size of 0.5 to 3 μm, a tap density of 3.0 to 5.0 g/cm$^3$, and an oxygen content of 0.05 to 0.15% by weight. Zinc oxide powder and, optionally, nickel powder are used as the inorganic oxide powder. The composition which contains the copper powder having such an oxygen content as low as 0.05 to 0.15% by weight, can provide copper conductors having excellent conductor properties such as solderability, adhesive strength and matching property to resistances.

3 Claims, No Drawings

COPPER CONDUCTOR COMPOSITION

BACKGROUND OF THE INVENTION

The present invention relates to a copper-containing conductor composition, and more particularly to a composition for providing a copper conductor which is formed into conductor patterns or electrodes on, mainly, ceramic substrates. The composition of the present invention can give excellent solderability (wettability by solder), adhesive strength, migration resistance and solder leach resistance to the conductor.

Thick film conductor compositions are composed of, generally, a conductive metal, an inorganic oxide and a glass powder as an inorganic bonding agent, which are in finely divided form and are dispersed in an organic vehicle. The conductive metal is ordinarily gold, silver, palladium, platinum, or mixtures and alloys thereof. However, these metals are noble metals, and they are expensive and have large fluctuations in price. When the noble metals other than gold are used as the conductive metal of the conductor composition, the obtained conductor has many troubles on its properties, for instance, high migration, poor solder leach resistance, high resistivity, and the like.

Accordingly, it has been strongly expected to substitute base metals, particularly copper metal, which are cheap and have small fluctuation in price, for the noble metals.

As to copper conductor compositions, hitherto, there have been utilized as the conductive metal ingredient spherical copper powders prepared in a wet process, a dry process, a combination thereof, and the like. However, commercially available copper powders have an oxide which contains at least 0.2% by weight oxygen as a copper oxide on the surface. That is, it can be considered that the copper powder is naturally oxidized during preparation process thereof or the powder is previously oxidized from the viewpoint of stability of copper. Since copper is very easily oxidized in air, even if the copper powder is subjected to antioxidation treatment, it is oxidized during the treatment to produce the oxide having at least 0.2% by weight oxygen.

The present inventors prepared various copper conductor compositions from the above-mentioned conventional copper powders. As a result, it has been found that the obtained copper conductor, in any compositions, could not satisfy all of properties required as conductor (conductor properties) such as solderability, adhesive strength, matching property to resistance, variation by preparation lots, due to at least 0.2% by weight oxygen in the oxide on the surface of the copper powder. On the other hand, when a copper powder put on the market is washed with an acid such as hydrochloric acid or nitric acid in order to remove an oxide from the surface, it can be considered that though the oxide layer on the surface can be removed therefrom immediately after washing, since the treated copper powder is remarkably easily oxidized during drying or storage, the amount of the oxide is consequently increased compared to the case that the copper is not treated.

An object of the present invention is to provide a copper conductor composition capable of providing a conductor satisfying all of the conductor properties.

This and other objects of the present invention will become apparent from the description hereinafter.

SUMMARY OF THE INVENTION

As to copper conductor compositions having excellent properties and preparation processes of the copper powder capable of giving excellent properties to the conductor, the present inventors have repeated earnest studies. As a result, it has now been found out a preparation process of stable copper powders which are lower in oxygen content than the conventional copper powders and found that the conductor compositions containing the above copper powders having low oxygen content can provide conductors having the excellent conductor properties.

In accordance with the present invention, there is provided a copper conductor composition comprising a copper powder, an inorganic oxide powder, a glass powder and an organic vehicle; the copper powder having an average particle size of 0.5 to 3.0 $\mu$m, a tap density of 3.0 to 5.0 g/cm$^3$ and an oxygen content of 0.05 to 0.15% by weight.

DETAILED DESCRIPTION

The copper conductor composition of the present invention is characterized by the copper powder having a low oxygen content. In the invention, as to ingredients other than the copper powder of the copper conductor composition, any ingredients used usually in the copper conductor composition can be used without any limitation. The copper conductor composition of the invention is composed of the copper powder, an inorganic oxide powder, a glass powder, an organic vehicle and, if necessary, a dispersing agent.

In the present invention, the copper powder has an average particle size of 0.5 to 3.0 $\mu$m, preferably from 0.5 to 2.5 $\mu$m. When the average particle size of the copper powder is less than 0.5 $\mu$m, it is hard to obtain the composition in the state of a paste. Even if the composition can be obtained in the state of a paste, blisters are easily produced during firing. On the other hand, when the average particle size is more than 3.0 $\mu$m, the conductor properties, particularly adhesive strength, cannot be improved.

The tap density of the copper powder is from 3.0 to 5.0 g/cm$^3$, preferably from 3.5 to 5.0 g/cm$^3$. The tap density is measured according to JIS-Z-2504. When the tap density of the copper powder is less than 3.0 g/cm$^3$, it is hard to obtain the composition in the state of a paste. On the other hand, when the tap density is more than 5.0 g/cm$^3$, the conductor properties, particularly adhesive strength and solderability, are poor.

The copper powder used in the copper conductor composition of the invention is lower in oxygen content than conventionally used copper powders. That is, in the present invention, the oxygen content of the copper powder is from 0.05 to 0.15% by weight, preferably from 0.1 to 0.15% by weight. The oxygen content is measured by RO 18 type inert gas melt-infrared absorption oxygen analyzer made by LECO CORPORATION. Such copper powders having low oxygen content can give excellent sintering property to the composition to prepare a close conductor film, thus the conductors having excellent resistivity and solderability can be obtained. When the oxygen content of the copper powder is less than 0.05% by weight, the stability of the copper powder is poor, so the copper powder is easily oxidized during preparation of the paste and the prepared conductor varies in the properties according to the used preparation lots. On the other hand when the oxygen content is more than 0.15% by weight, since the sintering property of the copper powder is poor, the solderability and adhesive strength become unsatisfactory. In order to improve the adhesive strength, copper oxide powder or bismuth oxide powder is generally added to the copper composition. The addition of copper or bismuth oxide powder can improve the adhesive strength, but exerts a bad influence on conductivity and solderability, and further matching property to resistor become poor.

The copper powder having low oxygen content as used in the invention can be obtained as follows:

An aqueous solution of a salt of copper, preferably copper sulfate, is reduced with glucose in the presence of an alkali hydroxide such as NaOH or KOH to give a reaction mixture containing a precipitate of a cuprous oxide powder (the first step). Then, the precipitate of cuprous oxide powder is separated from the reaction mixture by any separating means such as decantation, centrifugal separation or filtration. The obtained wet precipitate (squeezing ratio: about 15 to 30% by weight) is dispersed in water as it is, that is, the separated precipitate is dispersed in water without subjecting to any treatment such as drying. The aqueous dispersion is reduced with hydrazine to give a reaction mixture containing a precipitate of copper powder (the second step). Finally, the precipitate of copper powder is separated from the reaction mixture by decantation, centrifugal separation, filtration, and the like. The obtained precipitate is washed with water, dried and hydrogenated at a temperature of 150° to 250° C., to give a copper powder used in the present invention (the third step).

Thus obtained copper powder has the oxygen content of about 0.05 to 0.1% by weight, and even if the copper powder is stored in an ordinary atmosphere (the atmosphere) for about one month, the oxygen content of the copper powder reaches to at most 0.15% by weight.

It can be considered that the reason why thus obtained copper powder is very stable is that organic matter remaining on the surface of copper powder inhibits the oxidation of the copper powder during the hydrogenation (third step). The reason why the copper powder has the organic matter on its surface is that the copper powder is obtained by reducing the copper salt with glucose then reducing the wet precipitate of cuprous oxide with hydrazine.

In the above-mentioned process for preparing the copper powder, it is important that glucose is used as the reducing agent in the first step, the separated wet precipitate is dispersed in water as it is in the second step, and the third step is conducted, that is, the obtained copper powder is hydrogenated, in order to obtain the copper powder having low oxygen content. When one of three conditions as mentioned above is not satisfied, i.e., when the reduction of the copper sulfate is conducted by using other reducing agents than glucose in the first step, the precipitate of cuprous oxide powder is dried before dispersing in the second step, or the third step, the hydrogenation of copper powder is omitted, the oxygen content of the obtained copper powder becomes not less than 0.2% by weight.

When the copper conductor composition has the copper powder prepared according to the above-mentioned preparation process, the obtained composition can provide the copper conductors having excellent conductor properties such as solderability, adhesive strength and matching property to resistor.

As the inorganic oxide powder, zinc oxide powder is preferably used. The amount of the zinc oxide powder is from 0.2 to 3 parts by weight, preferably from 0.5 to 2 parts by weight, based on 100 parts by weight of the copper powder. When the amount of the zinc oxide powder is less than 0.2 part by weight based on 100 parts by weight of the copper powder, the desired adhesive strength cannot be obtained. On the other hand, when the amount is more than 3 parts by weight, the solderability becomes poor.

In the present invention, the copper conductor composition may contain nickel oxide powder in addition to zinc oxide powder to promote adhesive strength. The amount of nickel oxide is, when adding it, from 0 to 2.0 parts by weight, preferably from 0 to 1.0 part by weight, based on 100 parts by weight of the copper powder, within the range of the total amount of the inorganic oxide powder of not more than 3 parts by weight. Although the adhesive strength is sufficient on practical use even if nickel oxide is not added, the addition of up to 2 parts by weight of nickel oxide can further improve the adhesive strength. When the amount of nickel oxide is more than 2 parts by weight, the solderability becomes poor.

The average particle size of the inorganic oxide powder is from 0.5 to 5 $\mu$m, preferably from 1 to 3 $\mu$m.

Examples of the glass powders are, for instance, borate glasses such as lead borate glass, borosilicate glasses such as lead borosilicate glass and zinc borosilicate glass, and the like. The glass powder may be used alone or as an admixture thereof. The amount of the glass powder is from 1 to 10 parts by weight, preferably from 2 to 8 parts by weight, based on 100 parts by weight of the copper powder.

The average particle size of the glass powder is from 0.5 to 10 $\mu$m, preferably from 1 to 5 $\mu$m.

Usually used organic vehicles in the copper conductor composition are applicable to the present invention without particular limitation. Examples of the organic vehicles are, for instance, a solvent such as an aliphatic alcohol, an ester of aliphatic alcohol, e.g., acetate or propionate of an aliphatic alcohol, a terpene e.g. wood turpentine oil, a terpineol; a solution wherein a resin such as a polymethacrylate of lower alcohol or ethyl cellulose is dissolved in the above-mentioned solvent; and the like.

The composition of the present invention may contain other additives such as a dispersing agent. As each ingredient of the composition except the copper powder of the present invention, goods on the market may be used.

The copper conductor composition is composed of 100 parts by weight of the copper powder having an average particle size of 0.5 to 3.0 $\mu$m, a tap density of 3.0 to 5.0 g/cm$^3$ and an oxygen content of 0.05 to 0.15% by weight; 0.2 to 3 parts by weight, preferably from 0.5 to 2.0 parts by weight of zinc oxide powder and 0 to 2.0 parts by weight of nickel oxide powder; 1 to 10 parts by weight, preferably from 2 to 8 parts by weight, of the glass powder and 10 to 30 parts by weight, preferably from 10 to 20 parts by weight, of the organic vehicle.

As the substrate in the invention, the alumina ceramic substrates are used and also the beryllia ceramic substrates can be used.

The copper conductor composition is prepared by kneading the copper powder, the inorganic oxide powder and the glass powder with the organic vehicle to disperse the inorganic ingredients in the organic vehicle. Any kneading manners are applicable to the present invention, for instance, all of the ingredients are pre-kneaded by using a universal kneader and then kneaded by using a three roll mill. The obtained composition is in the state of a paste. The composition is applied to the alumina or beryllia ceramic substrate by screen printing, and the printed pattern is dried at 120° C. for 10 to 15 minutes. The dried pattern is finally fired at a temperature range of 850° to 1060° C. under nitrogen atmosphere. The overall firing procedure extends over a period of 40 minutes, keeping the peak firing temperature for about 5 to about 10 minutes.

The present invention is more specifically described and explained by means of the following Examples, in which all % are by weight unless otherwise noted. It is to be understood that the present invention is not limited to the Examples, and various changes and modifications may be made in the invention without departing from the sprit and scope thereof.

REFERENCE EXAMPLE 1

There was reduced 4.0 l of an aqueous solution of copper sulfate (concentration: 10%) with 150 g of glucose in the presence of 4 kg of 5% NaOH at a temperature of 60° C. for 30 minutes to give a reaction mixture containing a precipitate of cuprous oxide. The precipitate of cuprous oxide was separated from the reaction mixture in an amount of 1.5 kg by decantation. There was dispersed 500 g of the obtained wet precipitate (squeezing ratio: 20%) in 0.5 l of water, and the mixture was reduced with 50 g of hydrazine at a temperature of 50° C. for 90 minutes. A copper powder is separated from the reaction mixture in an amount of 80 g by centrifugation. The obtained copper powder was washed with water, dried and hydrogenated at a temperature of 230° C. for 5 hours.

The obtained copper powder had an average particle size of 1.0 $\mu$m, a tap density of 3.8 g/cm$^3$ and an oxygen content of 0.10%. [Copper powder (A)].

REFERENCE EXAMPLE 2

The procedure of Reference Example 1 was repeated except that the reduction temperature from copper sulfate to cuprous oxide was altered from 60° C. into 70° C. to give a powder.

The obtained copper powder had an average particle size of 2.0 $\mu$m, a tap density of 3.9 g/cm$^3$ and an oxygen content of 0.12% [Copper powder (B)]

REFERENCE EXAMPLE 3

The procedure of Reference Example 1 was repeated except that the squeezing ratio of cuprous oxide precipitate was altered from 20% to 30%.

The obtained copper powder had an average particle size of 3.0 $\mu$m, a tap density of 4.2 g/cm$^3$ and an oxygen content of 0.13% [Copper powder (C)].

EXAMPLES 1 TO 6 AND COMPARATIVE EXAMPLES 1 and 2

A universal mixer was charged with a copper powder, a zinc oxide powder, occasionally a nickel oxide powder, a glass powder and an organic vehicle according to the formulation shown in Table 1, and the mixture was pre-kneaded for 24 hours.

As the copper powder, five different copper powders having the following properties were used.

| Designation property | Copper powder | | | | |
|---|---|---|---|---|---|
| | A*1 | B*2 | C*3 | D*4 | E*5 |
| Average particle size ($\mu$m) | 1.0 | 2.0 | 3.0 | 1.0 | 2.0 |
| Tap density (g/cm$^3$) | 3.8 | 3.9 | 4.2 | 3.7 | 3.8 |
| Oxygen content (%) | 0.10 | 0.12 | 0.13 | 0.25 | 0.30 |

(Notes)
*[1]The copper powder obtained in Reference Example 1
*[2]The copper powder obtained in Reference Example 2
*[3]The copper powder obtained in Reference Example 3
*[4]Commercially available from Mitsui Mining & Smelting Co., Ltd. under a trade name Cu Fine Powder 1110, lot No. S-861009 PN
*[5]Commercially available from Mitsui Mining & Smelting Co., Ltd. under a trade name Cu Fine Powder, lot No. S-861003 PNCS As the glass powder, four different glass powders having the following properties were used.

| Designation property | Glass powder | | | |
|---|---|---|---|---|
| | Lead borosilicate | | Zinc borosilicate | Lead borate composite glass (D)*4 |
| | (A)*1 | (B)*2 | (C)*3 | |
| Average particle size ($\mu$m) | 3.5 | 4.0 | 3.0 | 4.0 |
| Softing point (°C.) | 490 | 435 | 563 | 353 |

(Notes)
All of the four different glass powders were commercially available from Nippon Denki Glass Kabushiki Kaisha. Trade names of the glass powders are as follows:
*[1]GA-8
*[2]GA-9
*[3]GA-12
*[4]LS-0803

The used zinc oxide powder was an extra pure reagent having an average particle size of 0.7 $\mu$m, which was commercially available from Takeuchi Yakuhin Kabushiki Kaisha. The used nickel oxide powder was an extra pure reagent having an average particle size of 0.5 $\mu$m, which was commercially available from Tokyo Kasei Kabushiki Kaisha.

The used organic vehicle was a mixture of terpineol and ethyl cellulose (100 cps) in a weight ratio of terpineol: ethyl cellulose=95:5.

The composition was mixed by passing through a three roll mill twelve times and then degassed in the universal mixer under in vacuo to give a copper conductor composition in the state of a paste. The obtained paste was applied to a 96% alumina substrate by using a screen printer to give a printed pattern. The printed pattern was dried at 120° C. for 10 minutes by using a hot-air dryer, and then fired in a belt conveyor furnace under a nitrogen atmosphere for one cycle time of 40 minutes. The firing profile was that the peak firing temperature was 900° C., and the peak firing temperature was kept for 7 minutes. The firing operation was repeated three times (three cycles).

With respect to the obtained conductor, the solderability and the adhesion strength were measured. The results are shown in Table 2.

[Solderability]
After conducting screen-printing, the printed pattern is fired as mentioned above to give a pattern (twenty 2 mm×2 mm pads).

The pattern is dipped in XA-100, which is a tradename for solder flux made by Tamura Kaken Kabushiki Kaisha, then is submerged in the solder (60% Sn - 40%

Pd) having a temperature of 250° C. for 5 seconds, and withdrawn. The withdrawn pattern is observed with the naked eye.

○: No pin hole.
△: Pin holes were observed on 1 to 5 pads from among the 20 pads.
X: Pin holes were observed on 6 or more pads from among the 20 pads.

[Adhesion strength]

After conducting screen-printing, the printed pattern is fired, as mentioned above to give a pattern (twenty 2 mm×2 mm pads).

The pattern is dipped in XA-100, then is submerged in the solder (60% Sn - 40% Pd) having a temperature of 250° C. for 5 seconds, and withdrawn.

Tinned copper wire having a diameter of 0.8 mmφ were attached to the 2 mm×2 mm pads by a soldering iron. As to the obtained samples, the adhesive strength is measured by using a pull tester, commercially available from Kabushiki Kaisha Shimdzu Seisakusho under the tradename "Autograph", at a pull rate of 10 mm/min at the time when copper thick film conductor is pulled off from the substrate. The adhesive strength was measured before aging (initial adhesive strength) and after aging the sample at 150° C. for 250 hours (adhesive strength after heat-aging). The results shown in Table 2 are averages of three samples, that is, 60 pads.

Initial adhesive strength

○: Average value of 3 samples, 60 pads is 3.0 kg/4 mm$^2$ or more
△: Average value of 3 samples, 60 pads is from 2.5 kg/4 mm$^2$ to less than 3.0 kg/4 mm$^2$
X: Average value of 3 samples, 60 pads is less than 2.5 kg/4 mm$^2$ Adhesive strength after heat-aging ○: Average value of 3 samples, 60 pads is 2.0 kg/4 mm$^2$ or more
△: Average value of 3 samples, 60 pads is from 1.5 kg/4 mm$^2$ to less than 2.0 kg/4 mm$^2$
X : Average value of 3 samples, 60 pads is less than 1.5 kg/4 mm$^2$

TABLE 2

| | | Adhesive strength (kg/mm$^2$) | |
|---|---|---|---|
| | Solderability | Initial adhesive strength | Adhesive strength after heat-aging |
| Ex. No. | | | |
| 1 | ○ | ○ | ○ |
| 2 | ○ | ○ | ○ |
| 3 | ○ | ○ | ○ |
| 4 | ○ | ○ | ○ |
| 5 | ○ | ○ | ○ |
| 6 | ○ | ○ | ○ |
| Com. Ex. | | | |
| 1 | △ | △ | X |
| 2 | △ | △ | X |

As aforementioned, the copper conductor composition of the present invention containing the copper powder having a low oxygen content of 0.05 to 0.15% by weight can provide the copper conductor having excellent solderability, adhesive strength and matching property to resistances.

In addition to the ingredients used in the Examples, other ingredients can be used in the Examples as set forth in the specification to obtain substantially the same results.

What we claim is:

1. A copper conductor composition comprising 100 parts by weight of a copper powder having an average particle size of 0.5 to 0.3 μm, a tap density of 3.0 to 5.0 g/cm$^3$ and an oxygen content of 0.05 to 0.15% by weight; 0.2 to 3 parts by weight of a zinc oxide powder having an average particle size of 0.5 to 5μm; 0 to 2 parts by weight of a nickel oxide powder having an average particle size of 0.5 to 5μm; 1 to 10 parts by weight of a glass powder and 10 to 30 parts by weight of an organic vehicle.

2. The composition of claim 1, wherein said copper powder is obtained by reducing a cuprous oxide powder with hydrazine to give a copper powder and then hydrogenating the copper powder.

3. The composition of claim 2, wherein said cuprous oxide powder is a wet precipitate of a cuprous oxide obtained by reducing a copper sulfate with glucose in an alkali hydroxide and separating from the reaction mixture.

* * * * *

TABLE 1

| | Copper powder | | Amount of zinc oxide (%) | Amount of nickel oxide (%) | Glass powder | | Amount of organic vehicle (%) |
|---|---|---|---|---|---|---|---|
| | Kind | Amount (%) | | | Kind | Amount (%) | |
| Ex. No. | | | | | | | |
| 1 | (A) | 75 | 1.0 | — | (A) (D) | 3.0 3.0 | 18.0 |
| 2 | (B) | 83 | 0.5 | — | (A) (D) | 2.0 2.5 | 12.0 |
| 3 | (C) | 82 | 1.0 | — | (A) (D) | 3.0 3.0 | 11.0 |
| 4 | (A) | 75 | 1.0 | 0.5 | (A) (B) | 3.0 3.0 | 17.5 |
| 5 | (B) | 83 | 2.0 | — | (C) (D) | 2.5 1.5 | 11.0 |
| 6 | (C) | 74.5 | 1.5 | — | (A) (D) | 1.5 2.5 | 20.0 |
| Com. Ex. | | | | | | | |
| 1 | (D) | 82 | 1.0 | — | (A) (D) | 3.0 3.0 | 11.0 |
| 2 | (E) | 82 | 1.0 | — | (A) (D) | 3.0 3.0 | 11.0 |

UNITED STATES PATENT AND TRADEMARK OFFICE
CERTIFICATE OF CORRECTION

PATENT NO. : 4,937,016
DATED : June 26, 1990
INVENTOR(S) : SUEHIRO et al

It is certified that error appears in the above-identified patent and that said Letters Patent is hereby corrected as shown below:

On the cover page, Item [75], after "Kyoto" insert --Seiichi Nakatani, Hirakata; Tsutomu Nishimura, Uji; all of--.

Column 8, line 29, "0.5 to 0.3 $\mu$m" should read --0.5 to 3.0 $\mu$m--.

Signed and Sealed this

Twenty-seventh Day of August, 1991

Attest:

HARRY F. MANBECK, JR.

*Attesting Officer*  *Commissioner of Patents and Trademarks*